United States Patent [19]

Wang et al.

[11] Patent Number: 4,538,246

[45] Date of Patent: Aug. 27, 1985

[54] NONVOLATILE MEMORY CELL

[75] Inventors: Samuel T. Wang, San Jose; Chenming Hu, Hercules; Ying Shum, Cupertino, all of Calif.

[73] Assignee: National Semiconductor Corporation, Santa Clara, Calif.

[21] Appl. No.: 437,608

[22] Filed: Oct. 29, 1982

[51] Int. Cl.³ .............................................. G11C 11/40
[52] U.S. Cl. .................................... 365/226; 365/228; 365/229
[58] Field of Search ........................ 365/228, 229, 226

[56] References Cited

U.S. PATENT DOCUMENTS 4,400,799  8/1983  Gudger .............................. 365/228
4,467,457  8/1984  Iwahashi et al. .................... 365/228

Primary Examiner—Terrell W. Fears
Attorney, Agent, or Firm—Michael J. Pollock; Paul J. Winters; Gail W. Woodward

[57] ABSTRACT

A static random access memory array cell that is nonvolatile because when power fails a floating gate is charged or not charged depending on the information content of the cell. When power is restored, all cells are written to a positive state except those with charged floating gates so that the information content of the array is recreated.

9 Claims, 6 Drawing Figures

NONVOLATILE MEMORY CELL

BACKGROUND OF THE INVENTION

The prior art recognizes several ways to form semiconductor memory cells using a field effect transistor (FET) formed on a substrate, with a source and drain region connected by a channel, the current in the channel being controllable with gates disposed over the channels. One type of cell uses an extra floating gate to control current flow in the cell so as to store a logical one or zero. The floating gate is charged by applying a higher than normal voltage to the selected cell so as to tunnel electrons to the otherwise insulated floating gate through a thin area in the insulating oxide. The electrons are trapped in the floating gate and, thus, keep it charged even if all electric power is removed from the cell. Hence, such floating gate cells are nonvolatile. However, the drawback to this approach is that one must use a higher than normal voltage to reprogram or write the cell. In addition, each time the tunneling process is used the thin oxide deteriorates a bit so that the cell has a limited lifespan, typically about 10,000 cycles.

Another type of memory cell comprises a bistable circuit formed usually from six FET devices. Such a circuit can be switched between two stable states, to represent a logical one or zero, by the application of a normal voltage. The lifespan of the circuit is not limited and switching times, and therefore write times, are much faster than that needed to charge a floating gate. The drawback of these circuits is that they require a lot of space and further are volatile, losing the stored information upon a power failure.

The prior art has contemplated combining the advantages of the above described cells by using floating gate arrangements added to the bistable circuits so as to store the logical information during power failures. A suitable detection circuit responds to a loss of power by applying a quick, higher than normal, voltage pulse to the circuit in such a way as to charge one of two different floating gates depending on the state of the bistable circuit. The two floating gates are positioned to affect the threshold voltage of two different FET's in the bistable circuit respectively so that, when power is restored, the circuit turns on in the same state it had when it turned off. The logical information is thereby recreated and the memory array formed from these cells is non-volatile. Since the floating gates are charged and discharged only during power lapses, rather than at each rewrite, the lifespan is considerably improved. And since each rewrite is done with the simple switching of fast FET's at normal voltages, high speed is retained. But with six FET's, two floating gates, and two thin oxides, complexity and size become the drawback of this approach.

The present invention allows the construction of a nonvolatile bistable memory cell that needs only one floating gate and only three or four FET's, thus substantially reducing complexity and size.

SUMMARY OF THE INVENTION

Very briefly, this invention employs a specialized device called an enhancement capacitor that couples pump voltage to the cell only when the cell is charged positive representing one logical state. The pump voltage maintains a simplified bistable latch circuit positive. A single floating gate works in conjunction with the capacitor and circuit so as to become charged, upon application of a higher than normal voltage to the circuit when power is lost, provided the cell is in one selected state, either positive or negative. Two different embodiments are shown. The floating gate, when charged, operates to disable the bistable circuit from being charged positive. When power is restored, external control circuits first attempt to charge all of the cells in the array positive. But only those cells that are not disabled by a charged floating gate actually switch positive. Next the external control circuits once again apply a higher than normal voltage in such a way as to discharge all the floating gates. Now the bistable circuit can be reprogrammed by the application of conventional voltages.

DESCRIPTION OF THE PREFERRED EMBODIMENT

Figure 1:
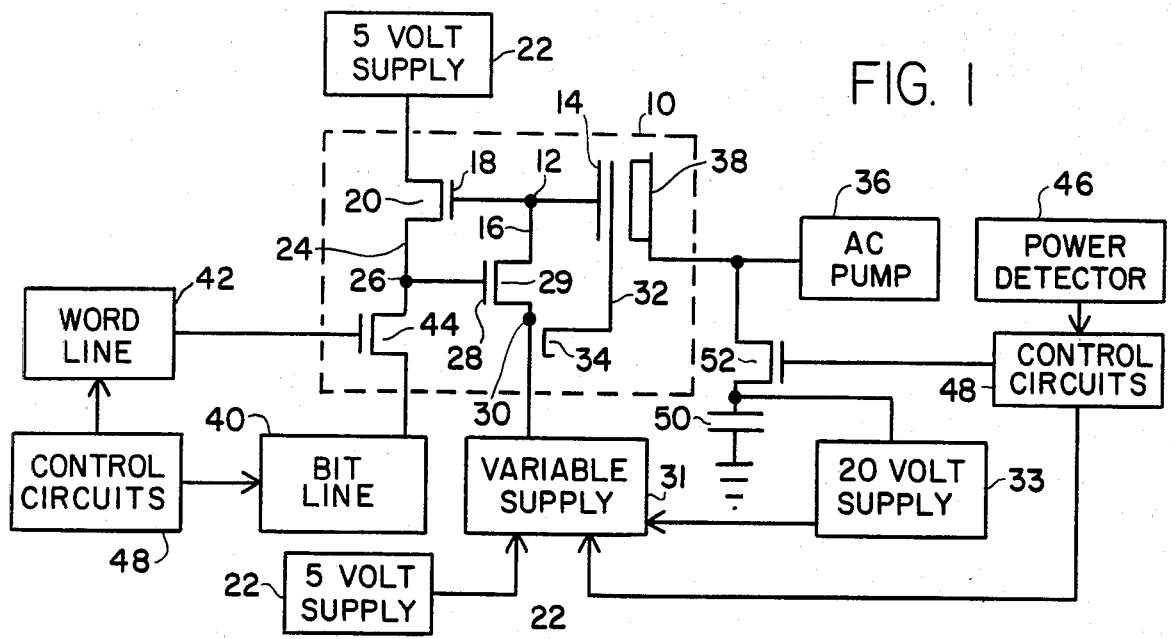
FIG. 1 is a circuit diagram of a three FET cell that charges the floating gate only if the bistable circuit is positive.
Figure 2:
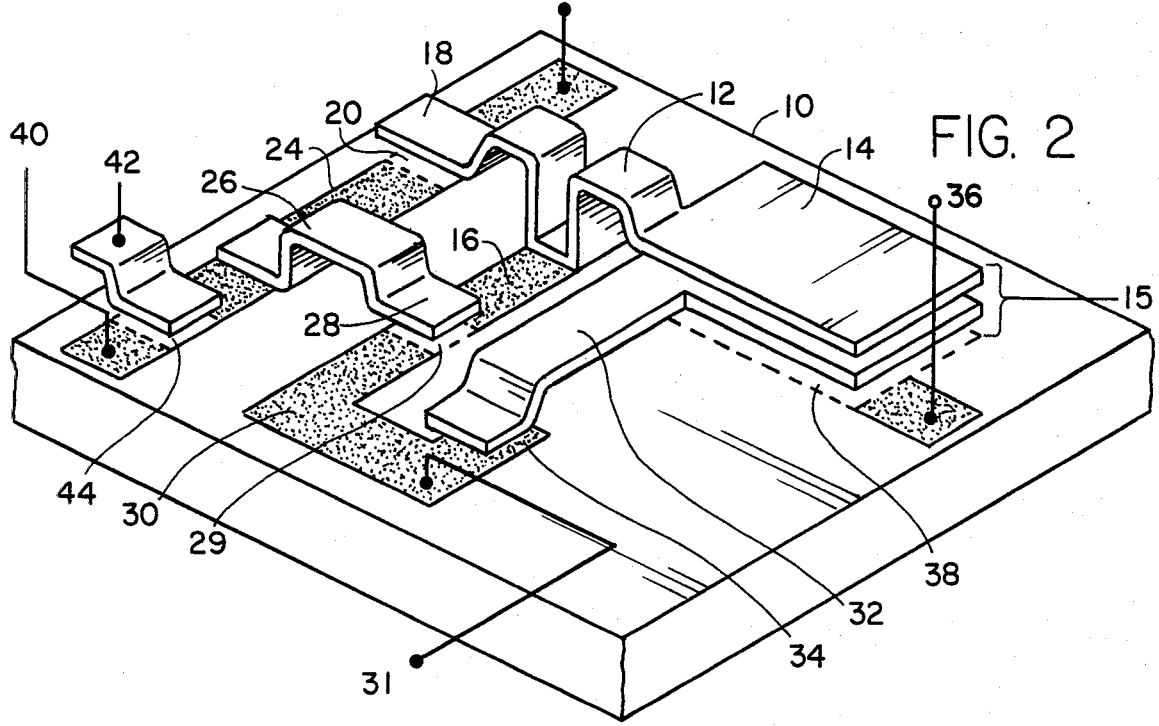
FIG. 2 shows schematically how the circuit and the enhancement capacitor of FIG. 1 might be constructed on an integrated circuit substrate.

The operation of the first embodiment may be understood by simultaneously considering both FIGS. 1 and 2. FIG. 2 shows a portion of the substrate that comprises the memory cell 10. All the insulating oxide is omitted from FIG. 2 for easier visibility. Electrically conductive paths, formed by suitable doping methods, are represented by the dotted paths while channel type areas are delineated with dashed lines. The elements of FIG. 2 are related to their equivalent circuit symbols in FIG. 1 by identical numbers.

A node 12 is connected to a plate 14 of the enhancement capacitor 15, a conductive path 16, and the control gate 18 of a FET 20. FET 20 conducts voltage from a five-volt supply 22, through a path 24 to a node 26, and thence to the control gate 28 of a FET 29. FET 29 conducts voltage from variable supply 31, through a node 30 and itself to node 12. In the preferred embodiment, variable supply 31 varies between 5 and 20 volts, supplied from five volt supply 22 or a 20 volt supply 33.

A floating gate 32 is positioned proximate node 30 and separated therefrom only by a very thin oxide 34 through which electron tunneling can occur given sufficient electric field differentials across the thin oxide. Gate 32 is also proximate enhancement capacitor 15, positioned between plate 14 and an inversion area 38. An AC pump 36 supplies area 38 with an alternating zero to five volt signal that is coupled to node 12 only if node 12 is positive and at about five volts. The positive voltage, from node 12, on plate 14 inverts channel area 38 in a well known manner so that channel area 38 becomes conductive. The alternating voltage is conducted into area 38 and capacitively coupled to plate 14 and node 12. If, however, floating gate 32 is charged negative by electrons tunneled through thin oxide 34, the positive field from plate 14 is blocked, area 38 made nonconductive, and AC coupling prevented.

In operation, the particular cell 10 is addressed in the memory array by signals from a bit line 40 and a word line 42 in a well known manner. A FET 44 turns on to supply a zero volt or five volt write signal from bit line 40 to the first node 26. If a read operation were in progress, bit line 40 would simply be connected to node 26 to see what voltage was present there. If a five volt write signal is applied to first node 26, FET 29 turns on and supplies a five volt potential from variable supply 31 to the second node 12 and also to gate 18 and plate 14. FET 20 turns on to conduct five volts from supply 22 to the first node 26 so as to hold the circuit at five volts even when the write signal from bit line 40 is removed. Threshold voltage drops in FETs 20 and 29 would cause a reduction in the circuit voltage but this is compensated for by the AC pump voltage from pump 36 that is coupled to node 12 since node 12 and plate 14 are positive.

IF bit line 40 now supplies a zero volt write signal to first node 26, FET 29 will turn off, dropping node 12 to zero which turns off both enhancement capacitor 15 and FET 20. Thus, both nodes 26 and 12 go to zero and stay there. Hence a bistable circuit is created by just two FETs, 20 and 29, and a capacitor 15. Other more complicated bistable circuits may be utilized with the floating gate disable circuit described herein but the one described is believed to be most efficient.

Figure 3:
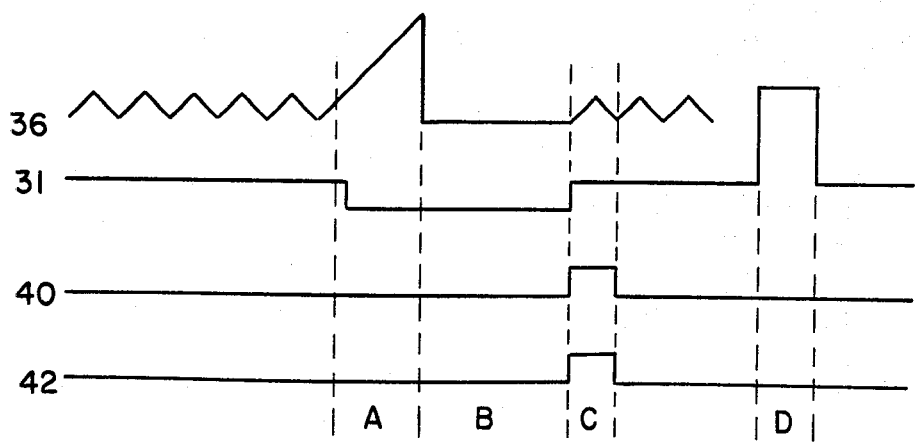
FIG. 3 graphs the relative times of events for the circuit of FIGS. 1 and 2.

FIG. 3 shows the sequence of signals used to make the cell nonvolatile. If the power stops at the beginning of interval A, the interruption is detected by a power detector circuit 46 which activates control circuits 48, causing them to produce a store signal. Control circuits 48 turn off variable supply 31 so as to change third node 30 to zero volts. At the same time, control circuits 48 provide a 20 volt pulse to area 38 where it is capacitively coupled into floating gate 32. One way to create the 20 volt pulse would be to have a storage capacitor 50 held at 20 volts by supply 33. The voltage from storage capacitor 50 would be coupled by a transistor 52 to all of the cells in the array via the AC pump connection.

Floating gate 32, being pulled to a much higher voltage than node 30, will attract electrons through thin oxide 34 and become negatively charged. But this only happens in the cells that were in a first state with node 12 at a positive voltage, since a positive node 12 is a precondition to having area 38 conductive so that the 20 volt pulse store signal can be capacitively coupled into floating gate 32. Cells that were at zero volts, have the enhancement capacitor 15 turned off and hence their floating gates are not charged.

During the interval B, in FIG. 3, power is off, but the electrons on the charged floating gates remain trapped in place, thus retaining information on which bistable circuits, or cells, were at the first positive state. When power is restored, at the start of interval C, control circuits 48 operate to reset all the cells in the array. Word line 42 and bit line 40 are both driven high so as to apply five volts to first node 26. This will turn on FET 29 as usual, but node 12 cannot be made to stay at five volts if a negatively charged floating gate 32 holds capacitor 15 off. Hence, the only cells that switch to a positive first state are those that were originally at a second state of zero volts when the power stopped, and thus did not have their floating gates charged negative.

The other cells are disabled by the floating gate. All the information is thus recreated, although with reversed polarity.

Shortly thereafter, at interval D, control circuits 48 drive variable supply 31 to 20 volts so as to attract electrons to node 30, through thin oxide 34, and discharge all floating gates that have a negative charge. Normal bistable circuit operation may now resume. The reversed polarity output is compensated by any suitable output inverting circuit, one of which is shown in FIG. 4.

Figure 4:
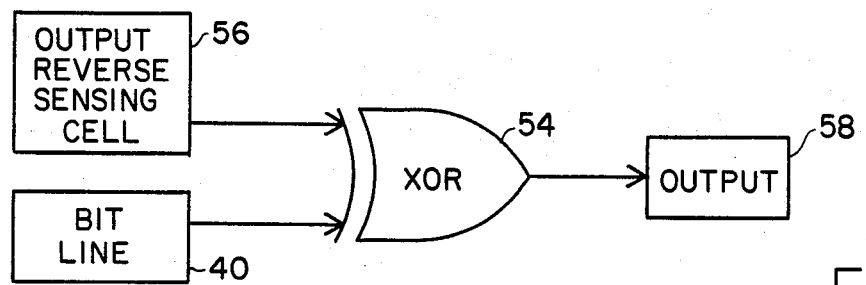
FIG. 4 shows an external circuit to invert the output from the cell of FIG. 1.

FIG. 4 shows an exclusive - or circuit 54 which receives the output signal on bit line 40 along with the output of another cell 56 dedicated to the purpose of just switching back and forth with each power outage. Whenever the data switches polarity on bit line 40, cell 56 also switches, and the output 58 remains consistent.

Figure 5:
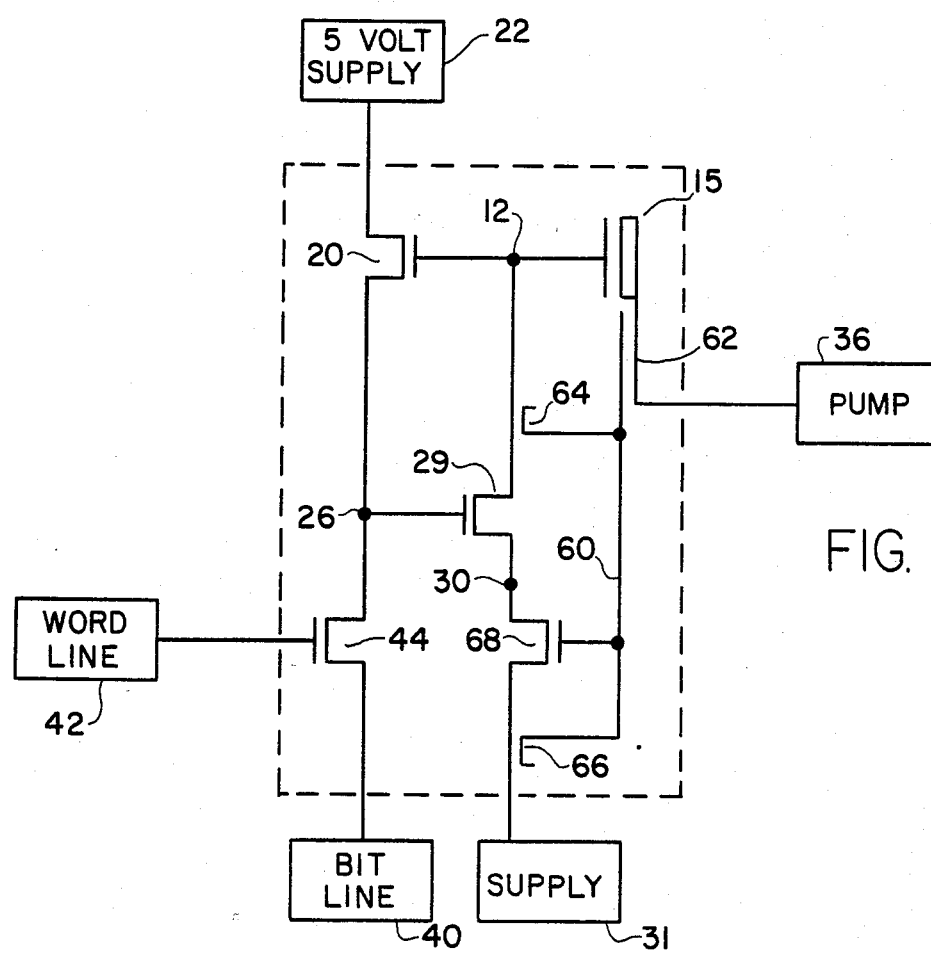
FIG. 5 is a circuit diagram of another embodiment of the invention, using four FETs, that charges the floating gate only if the bistable circuit is at zero volts.

FIG. 5 shows another embodiment of the invention wherein the floating gate is charged negative only if the bistable circuit is at zero volts when the power stops. All similar elements are numbered the same as in FIG. 1, and those similar elements operate the same way as described earlier. A floating gate 60 is located proximate the connection to the pump voltage at 62 so that the 20 volt store signal from the control circuits may be induced into floating gate 60. Two thin oxide areas are provided at 64 and 66 so that the floating gate 60 is proximate both node 12 and the connection between supply 31 and a FET 68.

Figure 6:
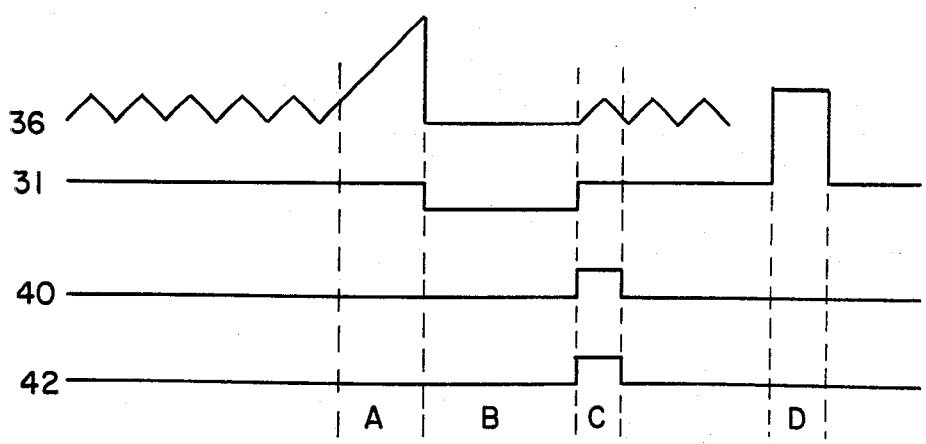
FIG. 6 is a graph showing the relative timing of events for the circuit of FIG. 5.

FIG. 6 demonstrates the sequence of events for the circuit of FIG. 5. At A, following power loss, a 20 volt store signal is again capacitively coupled to floating gate 60 to raise its potential. However, variable supply 31 remains at 5 volts, or may even be raised a bit, so that an insufficient electric field extends across thin oxide area 66 to permit tunneling. Only if the bistable circuit is at zero volts will an intense enough electric field exist, across thin oxide 64, to tunnel electrons onto floating gate 60. Thus, all cells at zero volts will have their floating gates charged negative. Just as before, at interval C, all cells receive a five volt write signal from bit line 40 so as to reset all the cells. However, the cells with charged floating gates are disabled again, and cannot be switched to five volts, because the normally conducting FET 68 is turned off, its control gate being connected to the negatively charged floating gate 60. As a result, the only cells that switch to five volts are those that originally were at five volts before power loss. The data is recreated, this time with the same polarity as the original data. At interval D, a 20 volt pulse from supply 31 discharges floating gate 60, through thin oxide 66, in the same manner as described earlier.

We claim:

1. A nonvolatile static semiconductor random access memory cell for use in array of cells comprising:
   means to generate a store signal if the power to said cell is interrupted;
   a bistable circuit operable to maintain a first state when switched to said first state and operable to maintain a second state when switched to said second state;
   floating gate means operable to maintain a first negatively charged condition in response to said store signal if said bistable circuit is in one of said states and a second uncharged condition if said bistable circuit is in the other state, said first and second conditions being maintained when outside power is interrupted;

disabling means connected to prevent said bistable circuit from assuming said first state, when power is restored, if said floating gate means is in said first condition; and reset means operable to set said bistable circuit to said first state upon restoration of power unless said disabling means prevents reset wherein said bistable circuit comprises first, second, and third nodes, a first FET connected between said first node and the array supply voltage with its gate connected to said second node, a second FET connected between said second and third nodes with its gate connected to said first node, a variable voltage supply connected to said third node, said bistable circuit being switched to said first and second states by the application of first and second voltages respectively to said first node.

2. The cell of claim 1 in which said disabling means comprises an enhancement capacitor connected between said second node and a source of alternating pump voltage, said capacitor operable to couple pump voltage to the second node only when the bistable circuit is in the first state and further in which said floating gate means is positioned proximate both the enhancement capacitor, so as to block capacitive coupling, and the circuit at the third node, so as to be charged by electron tunneling from said third node.

3. The cell of claim 2 including means, connected to said first node, operable to invert the signal from said first node following each loss of power.

4. The cell of claim 1 in which said variable voltage supply is connected to said third node through a third FET, said second node is coupled through an enhancement capacitor to a source of alternating pump voltage, said capacitor operable to couple pump voltage to the second node only when the bistable circuit is in the first state, and in which said floating gate means is positioned proximate the connection to the pump voltage from said capacitor so as to receive induced voltage therefrom, and also proximate both the second node and the connection between the variable voltage supply and the third FET so as to permit electron tunneling therefrom and thereto, said floating gate also connected to the gate of said third FET.

5. The cell of claim 1 in which said first state comprises the condition wherein said bistable circuit is at a positive voltage and said second state comprises the condition wherein the bistable circuit is at ground potential.

6. The cell of claim 5 in which said bistable circuit comprises first, second, and third nodes, a first FET connected between said first node and the array supply voltage with its gate connected to said second node, a second FET connected between said second and third nodes with its gate connected to said first node, a variable voltage supply connected to said third node, said bistable circuit being switched to said first and second states by the application of first and second voltages respectively to said first node.

7. The cell of claim 6 in which said disabling means comprises an enhancement capacitor connected between said second node and a source of alternating pump voltage, said capacitor operable to couple pump voltage to the second node only when the bistable circuit is in the first state and further in which said floating gate means is positioned proximate both the enhancement capacitor, so as to block capacitive coupling, and the circuit at the third node, so as to be charged by electron tunneling from said third node.

8. The cell of claim 7 including means, connected to said first node, operable to invert the signal from said first node following each loss of power.

9. The cell of claim 6 in which said variable voltage supply is connected to said third node through a third FET, said second node is coupled through an enhancement capacitor to a source of alternating pump voltage, said capacitor operable to couple pump voltage to the second node only when the bistable circuit is in the first state, and in which said floating gate means is positioned proximate the connection to the pump voltage from said capacitor so as to receive induced voltage therefrom, and also proximate both the second node and the connection between the variable voltage supply and the third FET so as to permit electron tunneling therefrom and thereto, said floating gate also connected to the gate of said third FET.

* * * * *